US012700856B2

(12) United States Patent
Maung et al.

(10) Patent No.: US 12,700,856 B2
(45) Date of Patent: Aug. 4, 2026

(54) METHODS AND APPARATUS TO CONFIGURE A DEVICE USING TIMING

(71) Applicant: Texas Instruments Incorporated, Dallas, TX (US)

(72) Inventors: Win N Maung, Plano, TX (US); Richard Edwin Hubbard, Lavon, TX (US); Jonathan Lee Valdez, Bedford, TX (US); Mark Edward Wentroble, Plano, TX (US); Justin Silver, San Jose, CA (US); Anirudh Rustagi, Cupertino, CA (US); Ashwin Ramachandran, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/428,966

(22) Filed: Jan. 31, 2024

(65) Prior Publication Data

US 2025/0023558 A1     Jan. 16, 2025

Related U.S. Application Data

(60) Provisional application No. 63/525,737, filed on Jul. 10, 2023.

(51) Int. Cl.
*H03K 5/24* (2006.01)
*H03K 21/08* (2006.01)

(52) U.S. Cl.
CPC .............. *H03K 5/24* (2013.01); *H03K 21/08* (2013.01)

(58) Field of Classification Search
CPC .......... H03K 5/22; H03K 21/08; H03K 21/10; H03K 21/38; H03K 19/17772; H05K 5/24; G01R 19/165; G01R 19/16566; G01R 19/16576
See application file for complete search history.

(56) References Cited

U.S. PATENT DOCUMENTS 10,879,893 B1 * 12/2020 Vining ................. H03K 17/223
2016/0161563 A1 * 6/2016 Tu .......................... G01K 13/00
374/142

* cited by examiner

*Primary Examiner* — Long Nguyen
(74) *Attorney, Agent, or Firm* — Xianghui Huang; Frank D. Cimino

(57) ABSTRACT

An example apparatus includes: a capacitor having a terminal; comparator circuitry having an input terminal and an output terminal, the input terminal of the comparator circuitry coupled to the terminal of the capacitor; timer circuitry having an input terminal and an output terminal, the input terminal of the timer circuitry coupled to the output terminal of the comparator circuitry; and configuration determination circuitry having an input and an output, the input of the configuration determination circuitry coupled to the output of the timer circuitry; and a configuration register having an input coupled to the output of the configuration determination circuitry.

20 Claims, 8 Drawing Sheets

METHODS AND APPARATUS TO CONFIGURE A DEVICE USING TIMING

CROSS-REFERENCE TO RELATED APPLICATION

This patent application claims the benefit of and priority to U.S. Provisional Patent Application Ser. No. 63/525,737 filed Jul. 10, 2023, which is hereby incorporated herein by reference in its entirety.

TECHNICAL FIELD

This description relates generally to device configuration and, more particularly, to methods and apparatus to config-ure a device using timing.

BACKGROUND

Electronic systems, such as communication systems, become increasingly complex as the number of devices increases. Electronic systems include a plurality of devices that sequence performance of operations between the plu-rality of devices. In communication systems, each device may have a different configuration, which specifies a device address, to differentiate operations of each device of the system. In such systems, devices sequence communications between one another using different device addresses. Elec-tronic systems that utilize different device configurations can effectively share hardware resources. For example, in com-munication systems, each device is coupled to a shared communication bus. In such an example, each device uti-lizes a different configuration to implement a device address, which allows the devices to effectively communicate over the shared bus. Such device addressing allows circuitry to configure electronic systems for increasingly complex operations.

SUMMARY

For methods and apparatus to configure a device using timing, an example apparatus includes a capacitor having a terminal; comparator circuitry having an input terminal and an output terminal, the input terminal of the comparator circuitry coupled to the terminal of the capacitor; timer circuitry having an input terminal and an output terminal, the input terminal of the timer circuitry coupled to the output terminal of the comparator circuitry; and configuration determination circuitry having an input and an output, the input of the configuration determination circuitry coupled to the output of the timer circuitry; and a configuration register having an input coupled to the output of the configuration determination circuitry.

For methods and apparatus to configure a device using timing, an example device includes peripheral circuitry including: a capacitor having a terminal; comparator cir-cuitry having an input terminal and an output terminal, the input terminal of the comparator circuitry coupled to the terminal of the capacitor; and timer circuitry having an input terminal coupled to the output terminal of the comparator circuitry; and a connector including a resistor having a terminal coupled to the terminal of the capacitor and the input terminal of the comparator circuitry.

For methods and apparatus to configure a device using timing, yet another example apparatus includes a capacitor; comparator circuitry coupled to the capacitor, the compara-tor circuitry configured to compare a voltage at the capacitor to a threshold voltage; timer circuitry coupled to the com-parator circuitry, the timer circuitry configured to determine a time that the voltage of the capacitor is equal to the threshold voltage; and configuration determination circuitry coupled to the timer circuitry, the configuration determina-tion circuitry configured to determine a configuration responsive to determining the time.

BRIEF DESCRIPTION OF THE DRAWINGS

The same reference numbers or other reference designa-tors are used in the drawings to designate the same or similar (functionally and/or structurally) features.

DETAILED DESCRIPTION

Figure 1:
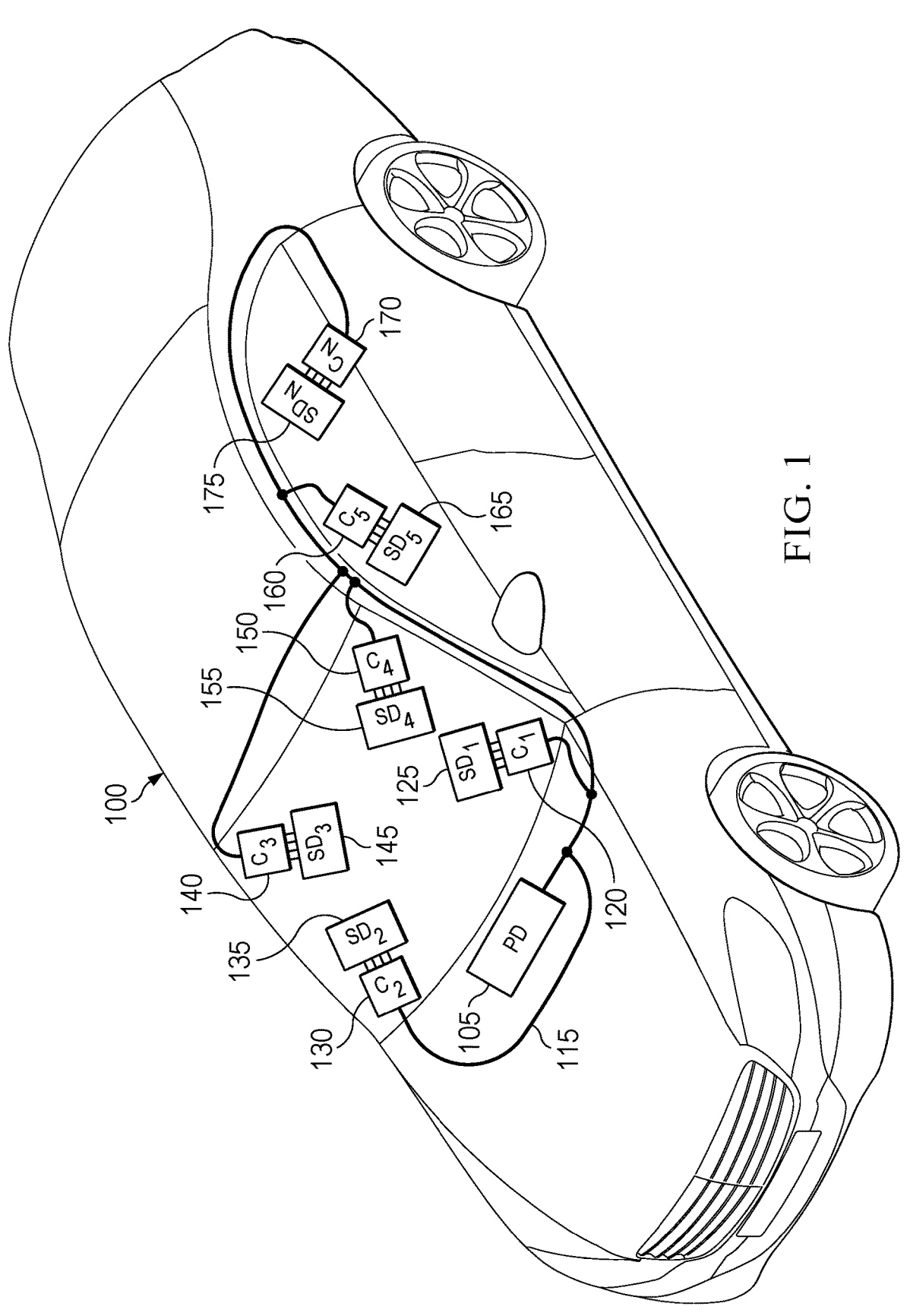
FIG. 1 is a block diagram of an example vehicle having a communication system including an example primary device, which uses example connectors to communicate with a plurality of secondary devices.

The drawings are not necessarily to scale. Generally, the same reference numbers in the drawing(s) and this descrip-tion refer to the same or like parts. Although the drawings show regions with clean lines and boundaries, some or all of these lines and/or boundaries may be idealized. In reality, the boundaries and/or lines may be unobservable, blended and/or irregular.

Electronic systems, such as communication systems, become increasingly complex as the number of devices increases. Electronic systems include a plurality of devices that sequence performance of operations between the plu-rality of devices. In communication systems, each device may have a different configuration, which specifies a device address, to differentiate operations of each device of the system. In such systems, devices sequence communications between one another using different device addresses. Elec-tronic systems that utilize different device configurations can effectively share hardware resources. For example, in com-munication systems, each device is coupled to a shared communication over the shared bus. In such an example, each device utilizes a different configuration to implement a device address, which allows the devices to effectively communicate. Such device addressing allows circuitry to configure electronic systems for increasingly complex operations.

Manufacturing and assembly complexity of systems increase as the number of unique devices that form the system increases. To reduce manufacturing and/or assembly complexity, designers include strap pins as an additional connection between devices. Strap pins or configuration pins are hardware terminals that, when coupled to a primary device, allow devices of a system to uniquely identify one another. In a communication system, a primary device is coupled to one or more secondary devices by a communication bus, and one or more configuration pins. In such systems, the primary device uniquely sets the one or more configuration pins to allow each secondary device to determine a configuration in the system. For example, the primary device is coupled to a secondary device by three strap pins that the primary device sets to one of a logic high or a logic low. In such an example, the secondary device determines a device configuration responsive to the state of the three strap pins. Using three strap pins allows the primary device to be coupled to up to eight secondary devices. Increasing the number of strap pin connections between the primary device and the secondary devices increases the number of possible different configurations, which increases the possible number of secondary devices. However, in relatively large-scale applications, such as controller area network (CAN) communication systems in which the devices may be separated by relatively large distances, each additional strap pin connection increases complexity and cost.

To decrease excessive connections between primary and secondary devices of a system, designers have implemented methods to use as few strap pin connections as possible. In some examples, each secondary device is coupled to the primary device by a single strap pin. In such examples, the primary device sets the voltage of the single strap pin to a unique value, which allows the secondary device to determine a corresponding address. However, the secondary devices need circuitry having a precision that allows for a unique voltage for each configuration. The precision of the voltage detection circuitry in each device increases as the number of potential configurations and/or devices in a system increases.

Examples described here include methods and apparatus to configure a device using timing. In some described examples, devices use one of a charging time or a discharging time of a resistor-capacitor circuit coupled to the strap pin to select a configuration of the device. Such devices may include comparator circuitry, timer circuitry, and configuration determination circuitry. The device uses circuitry to begin charging or discharging a capacitance coupled to the strap pin from an initial voltage. When charging or discharging, the rate of increase or decrease of the strap pin voltage varies based on a resistance and capacitance coupled to the strap pin. The comparator circuitry compares the strap pin voltage to a threshold voltage. The timer circuitry determines a time between beginning to charge or discharge the capacitance from the initial value until the comparator circuitry determines the strap pin voltage is approximately equal to the threshold voltage.

The configuration determination circuitry selects a configuration of the device responsive to the time determined by the timer circuitry. In some described examples, a configuration specifies a device address that is different for the devices of the system. For example, in a communication system, the devices have strap pins that are coupled to different resistances, which changes the charge or discharge time. In such an example, the devices select different configurations to have a different address for each device.

Advantageously, the strap pin of the device may not be directly coupled to a primary device for the secondary device to determine a configuration in a system. Advantageously, adjusting the resistance and/or capacitance coupled to the strap pin modifies the configuration of the secondary device. Advantageously, a single strap pin can be used for any number of unique devices within the system.

FIG. 1 is a block diagram of an example vehicle 100. In the example of FIG. 1, the vehicle 100 includes an example primary device 105, an example bus 115 (referred to in capital letters as a BUS 115), a first example connector $(C_1)$ 120, a first example secondary device $(SD_1)$ 125, a second example connector $(C_2)$ 130, a second example secondary device $(SD_2)$ 135, a third example connector $(C_3)$ 140, a third example secondary device $(SD_3)$ 145, a fourth example connector $(C_4)$ 150, a fourth example secondary device $(SD_4)$ 155, a fifth example connector $(C_5)$ 160, a fifth example secondary device $(SD_5)$ 165, a sixth example connector $(C_N)$ 170, and a sixth example secondary device $(SD_N)$ 175. The vehicle 100 uses the primary device 105 to communicate with the secondary devices 125, 135, 145, 155, 165, 175. In some example implementations, the vehicle 100 has one or more instances of any of the secondary devices 125, 135, 145, 155, 165, 175.

The primary device 105 is coupled to the connectors 120, 130, 140, 150, 160, 170 by the BUS 115. The primary device 105 receives data responsive to monitoring signal lines of the BUS 115. In some examples, the primary device 105 is an electronic control unit (ECU). The primary device 105 may be coupled to one or more additional ECUs. In such examples, the primary device 105 allows the one or more additional ECUs to receive data from or supply data to the BUS 115. For example, when the secondary devices 125, 135, 145, 155, 165, 175 are audio capture devices, such as microphones, the primary device 105 receives audio data by reading the bus 115. In such an example, the primary device 105 provides the audio data to the one or more additional ECUs, such as a cellular modem ECU.

In some examples, the primary device 105 implements controller area network (CAN) protocols. In such examples, the BUS 115 is implemented by signal lines carrying a differential pair of signals including a CAN high $(CAN_H)$ signal and a CAN low $(CAN_L)$ signal. The primary device 105 may broadcast data on the BUS 115. In some examples, a broadcast is a transmission of a data packet on the BUS 115. The primary device 105 or the secondary devices 125, 135, 145, 155, 165, 175 broadcast data by sequentially setting a voltage of the BUS 115. In some examples, the voltage of the BUS 115 is a voltage difference between signals of a differential pair of signals. For example, the voltage of the BUS 115 represents a recessive bit (e.g., a logical one, a logic high) responsive to one of the primary device 105 or the secondary devices 125, 135, 145, 155, 165, 175 releasing a drive current of the BUS 115.

In example operations, the primary device 105 or the secondary devices 125, 135, 145, 155, 165, 175 sequence use of the BUS 115 to prevent broadcasts from colliding. A broadcast collision occurs when multiple ones of the primary device 105 or the secondary devices 125, 135, 145, 155, 165, 175 attempt to broadcast data by setting the voltage of the BUS 115. In such example operations, the primary device 105 or the secondary devices 125, 135, 145, 155, 165, 175 detect the collisions responsive to the voltage of the BUS 115 representing a dominant bit, while another one of the primary device 105 or the secondary devices 125, 135, 145, 155, 165, 175 is attempting to broadcast a recessive bit.

When communicating using the BUS 115, in an example, each one of the secondary devices 125, 135, 145, 155, 165, 175 have an address specific to a location on the BUS 115. For example, when the secondary devices 125, 135, 145, 155, 165, 175 are audio capture devices, the secondary device 125 has a first address, which is identified by a first configuration, and the secondary device 135 has a second address, which is identified by a second configuration. In such examples, the first address corresponds to a microphone on a driver side of the vehicle 100, and the second address corresponds to a microphone on a passenger side of the vehicle 100. Device addresses are examples of configurations of the secondary devices 125, 135, 145, 155, 165, 175. When each of the secondary devices 125, 135, 145, 155, 165, 175 have different configurations (e.g., addresses), the secondary devices 125, 135, 145, 155, 165, 175 use the difference configurations to sequence use of the BUS 115 to implement operations unique to a location in the vehicle 100.

Figure 2:
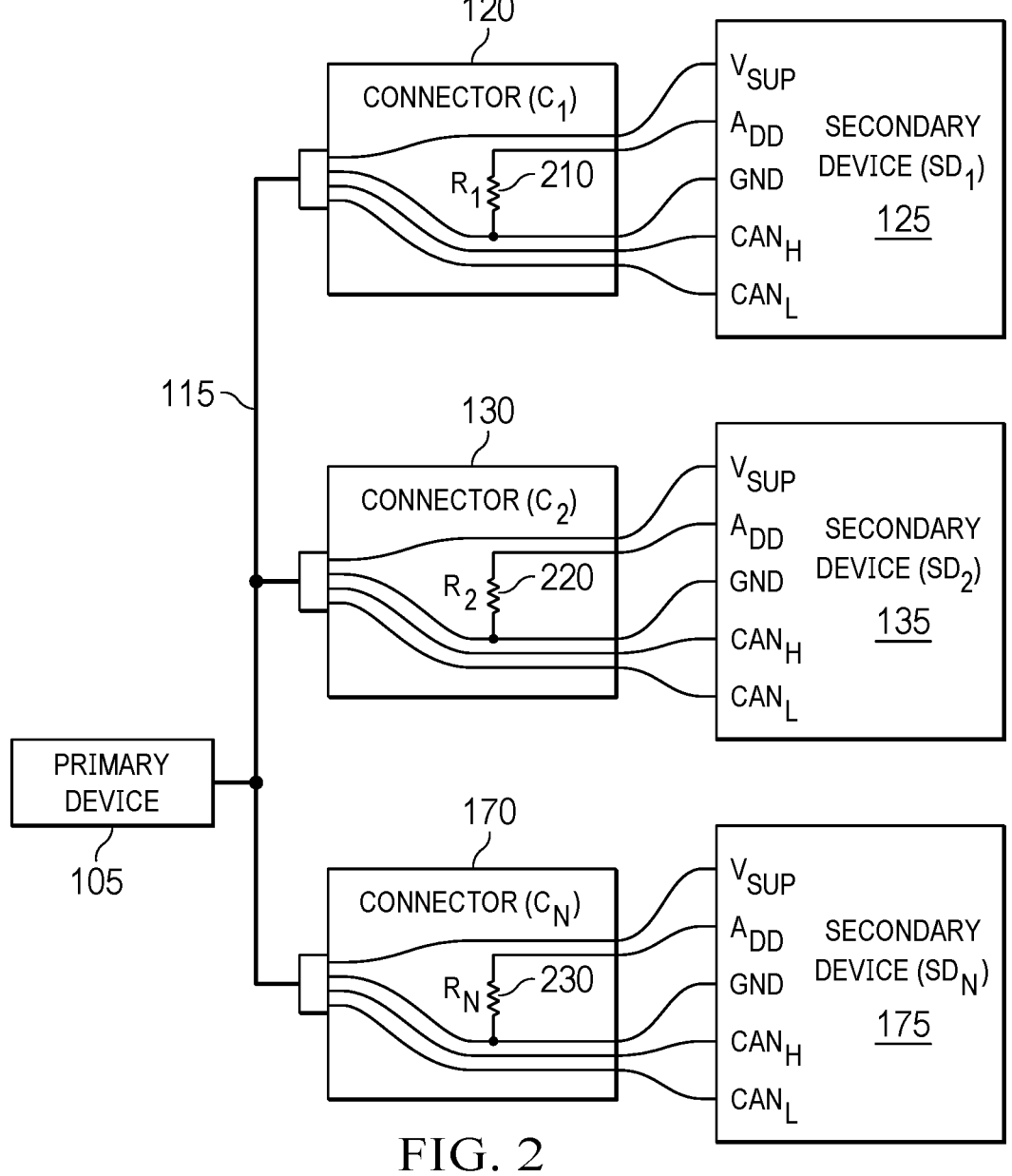
FIG. 2 is a block diagram of an example of the commu-nication system of FIG. 1 including the primary device of FIG. 1, the connectors of FIG. 1, and the plurality of secondary devices of FIG. 1.

The connectors 120, 130, 140, 150, 160, 170 couple the secondary devices 125, 135, 145, 155, 165, 175 to the BUS 115. In some examples, the connectors 120, 130, 140, 150, 160, 170 are one of D-subminiature connectors, multi-pin headers, multi-pin open connector, etc. The connectors 120, 130, 140, 140, 160, 170 allow the secondary devices 125, 135, 145, 155, 165, 175 to monitor and/or set voltages of the BUS 115. Each of the connectors 120, 130, 140, 150, 160, 170 are unique to a location in the vehicle 100. In some examples, during manufacturing of the vehicle 100, each of the connectors 120, 130, 140, 150, 160, 170 are specific to a location in the vehicle 100. For example, the connector 120 is manufactured specifically to be positioned (e.g., installed) as a lower driver side connector. In such an example, the connector 120 has an internal resistance, which has a resistance that identifies the positioning of the connector 120. As illustrated in FIG. 2, the connectors 120, 130, 140, 150, 160, 170 have internal resistances, which form pull down resistors for one or more connections of the secondary devices 125, 135, 145, 155, 165, 175. Each of the connectors 120, 130, 140, 150, 160, 170 have different internal resistances, which are specific to a location of the connected one of the secondary devices 125, 135, 145, 155, 165, 175 in the vehicle 100. Advantageously, the unique internal resistances of the connectors 120, 130, 140, 150, 160, 170 allow the secondary devices 125, 135, 145, 155, 165, 175 to determine a location in the vehicle 100. Advantageously, the secondary devices 125, 135, 145, 155, 165, 175 select different configurations (e.g., addresses) responsive to different internal resistances of the connectors 120, 130, 140, 150, 160, 170. For example, the secondary device 145 selects a configuration, which specifies an address, responsive to a unique internal resistance of the connector 140.

In an example, each one of the secondary devices 125, 135, 145, 155, 165, 175 are an instance of the same device circuitry. However, when coupled to one of the connectors 120, 130, 140, 150, 160, 170, the secondary devices 125, 135, 145, 155, 165, 175 each select a different configuration (e.g., an address) responsive to the connectors 120, 130, 140, 150, 160, 170 having different internal resistances. For example, the secondary device 155 has a first configuration responsive to the internal resistance of the connector 150, and the secondary device 165 has a second configuration responsive to the internal resistance of the connector 160.

In example operations, following a power on of the vehicle 100, the secondary devices 125, 135, 145, 155, 165, 175 set a voltage of a configuration pin. The secondary devices 125, 135, 145, 155, 165, 175 monitor the voltage of the configuration pin over a duration of time. When the voltage of the configuration pin reaches a threshold voltage, the secondary devices 125, 135, 145, 155, 165, 175 determine the time between setting the voltage of the configuration pin and the voltage being approximately equal to the threshold voltage. In such example operations, the unique internal resistance of each one of the connectors 120, 130, 140, 150, 160, 170 adjust the time determined by the secondary devices 125, 135, 145, 155, 165, 175. The secondary devices 125, 135, 145, 155, 165, 175 select an address and/or configuration responsive to the determined time. Advantageously, the secondary devices 125, 135, 145, 155, 165, 175 determine an address and/or configuration responsive to a timing characteristic of a resistor-capacitor circuit that includes the unique resistance of the connectors 120, 130, 140, 150, 160, 170. Advantageously, using such a method of address and/or configuration determination reduces manufacturing complexity of both the vehicle 100 and the secondary devices 125, 135, 145, 155, 165, 175. Advantageously, using timing to determine an address and/or configuration reduces a number of configuration connections needed in systems having multiple ones of the secondary devices 125, 135, 145, 155, 165, 175.

Although in the example of FIG. 1, the primary device 105 and the secondary devices 125, 135, 145, 155, 165, 175 implement CAN protocols, the primary device 105 and the secondary devices 125, 135, 145, 155, 165, 175 may implement alternative communication protocols. For example, the primary device 105 and the secondary devices 125, 135, 145, 155, 165, 175 may use local internet network (LIN) protocols to facilitate communications. In such an example, characteristics of the connectors 120, 130, 140, 150, 160, 170 allow the secondary devices 125, 135, 145, 155, 165, 175 to select different configurations having different addresses. Alternatively, the methods and apparatus described herein may be implemented, with slight modifications, for a wide range of communication protocols.

FIG. 2 is a block diagram of an example communication system including the devices 105, 125, 135, 175 of FIG. 1, the BUS 115 of FIG. 1, and the connectors 120, 130, 170 of FIG. 1. In the example of FIG. 2, the connector 120 includes a first example resistor 210. The connector 130 includes a second example resistor 220. The connector 170 includes a third example resistor 230.

The resistors 210, 220, 230 are coupled between a strap terminal (ADD) of the secondary devices 125, 135, 175 and a common terminal (GND) that supplies a common potential (e.g., ground). In some examples, the resistors 210, 220, 230 are referred to as pull-down resistors, and the strap terminal is referred to as a configuration terminal or pin. In this example, each of the resistors 210, 220, 230 have a unique resistance that corresponds to a location in a system. For example, the resistance of the resistor 210 corresponds to a first connector placement, and the resistance of the resistor 220 corresponds to a second connector placement. In such an example, the first connector placement corresponds to the driver side of the vehicle 100, and the second connector placement corresponds to a passenger side of the vehicle 100.

In example operations, the secondary devices 125, 135, 175 couple the strap terminal to a supply voltage ($V_{SUP}$). The secondary devices 125, 135, 175 monitor the voltage of the strap terminal until the voltage is approximately equal to a threshold voltage. The secondary devices 125, 135, 175 determine a time between the strap terminal being at an initial voltage and the voltage of the strap terminal being approximately equal to the threshold voltage. In some examples, such as the example operations of the flowchart of FIG. 7, the initial voltage of the strap terminal is approximately equal to a common potential (e.g., ground). In other examples, such as the example operations of the flowchart of FIG. 8, the initial voltage of the strap pin is a reference voltage. In such examples, the strap pin is approximately equal to the reference voltage responsive to charging a capacitance. The secondary devices 125, 135, 175 determine an address and/or configuration responsive to the determined time. For example, the secondary device 125 has a first address responsive to determining a first time, which corresponds to the resistor 210. Similarly, the secondary device 135 has a second address responsive to determining a second time, which corresponds to the resistor 220. Advantageously, additional instances of the secondary devices 125, 135, 175 may be coupled to the BUS 115 by additional instances of the connectors 120, 130, 170 with unique resistances. Example implementations of the secondary devices 125, 135, 175 are illustrated and described in connection with FIGS. 3 and 4, below.

Figure 3:
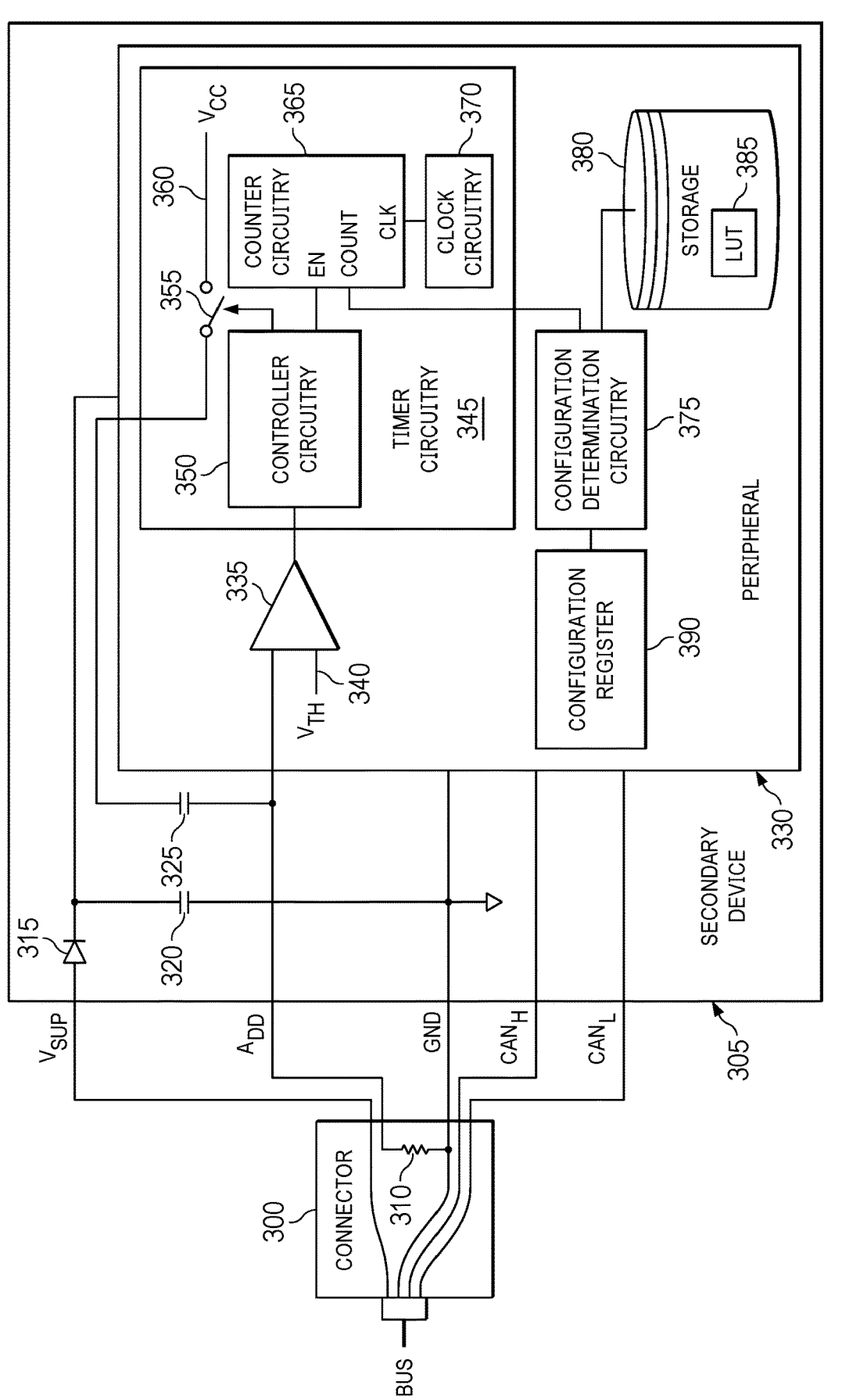
FIG. 3 is a schematic diagram of an example connector and an example secondary device.

FIG. 3 is a schematic diagram of an example connector 300 and an example secondary device 305, which may represent any of the connectors or secondary devices shown in FIGS. 1 and 2. In the example of FIG. 3, the connector 300 has an example resistor 310. In the example of FIG. 3, the secondary device 305 has an example diode 315, a first example capacitor 320, a second example capacitor 325, and example peripheral circuitry 330. The peripheral circuitry 330 includes example comparator circuitry 335, which receives an example threshold voltage 340, example timer circuitry 345, example configuration determination circuitry 375, an example storage 380, which includes an example look-up-table (LUT) 385, and an example configuration register 390. The timer circuitry 345 includes example controller circuitry 350, an example switch circuitry 355, example counter circuitry 365, and example clock circuitry 370. Alternatively, the peripheral circuitry 330 may include additional circuitry to perform one or more additional operations, such as circuitry to receive and/or transmit data using the CAN BUS signals and/or sensors to collect data to be transmitted. Also shown is an example common collector voltage ($V_{CC}$) 360.

The resistor 310 has a first terminal coupled to the capacitor 325 and a second terminal coupled to the capacitor 320, the peripheral circuitry 330, and a common terminal (GND), which supplies a common potential (e.g., ground). In the example of FIG. 3, the resistor 310 is coupled between the strap pin ($A_{DD}$) of the secondary device 305 and the common terminal (GND). For example, the resistor 310 has a resistance that corresponds to a location of the secondary device 305 in a system, such as the vehicle 100 in FIG. 1. In one example, the connector 300 represents the connector 120, and the secondary device 305 represents the secondary device 125. In this example, the resistor 310 has a resistance value that corresponds to and identifies a driver side location in the vehicle 100. In another example, the connector 300 represents the connector 130, and the secondary device 305 represents the secondary device 135. In this example, the resistor 310 has a resistance value that corresponds to and identifies a passenger side location in the vehicle 100.

The diode 315 has a first terminal coupled to the connector 300 and a second terminal coupled to the capacitor 320 and the peripheral circuitry 330. The diode 315 receives a supply voltage ($V_{SUPP}$) from the connector 300. The diode 315 supplies the supply voltage to the capacitor 320 and the peripheral circuitry 330. The diode 315 regulates the flow of current from the connector 300 to the capacitor 320 and/or the peripheral circuitry 330. In example operations, the diode 315 allows current to flow from the connector 300 to the capacitor 320 and/or the peripheral circuitry 330 and prevents current from flowing from the capacitor 320 and/or the peripheral circuitry 330 to the connector 300. Alternatively, in some examples, the diode 315 may not be illustrated. In such examples, the secondary device 305 does not include circuitry, such as an additional voltage source, which may supply a reverse current to the connector 300.

The capacitor 320 has a first terminal coupled to the diode 315 and the peripheral circuitry 330 and a second terminal coupled to the resistor 310, the peripheral circuitry 330, and the common terminal. The capacitor 320 receives the supply voltage from the diode 315. In some examples, the capacitor 320 averages relatively high frequency noise of the supply voltage to filter out variations in the supply voltage. In such examples, the capacitor 320 prevents sudden changes in the supply voltage from being supplied to the peripheral circuitry 330. Also, when the diode 315 supplies the supply voltage, the capacitor 320 charge. The capacitor 320 discharges responsive to the diode 315 no longer supplying the supply voltage. The capacitor 320, while discharging, uses stored charges to resist the sudden change in the supply voltage. For example, when the vehicle 100 is turned off, the BUS 115 of FIGS. 1 and 2 no longer supply the supply voltage. In such an example, the capacitor 320 resists the sudden change in the supply voltage by discharging and supplying current to the peripheral circuitry 330. Advantageously, the capacitor 320 stabilizes a supply of power to the peripheral circuitry 330.

The capacitor 325 has a first terminal coupled to the resistor 310 and the comparator circuitry 335 and a second terminal coupled to the switch circuitry 355. The capacitor 325 forms a resistor-capacitor (RC) circuit with the resistor 310. The RC circuit sets the voltage of the first terminal of the capacitor 325, which may be referred to as the strap pin voltage. The strap pin voltage is dependent on time responsive to the formation of such an RC circuit. The RC circuit of the resistor 310 and the capacitor 325 has a time constant ($\tau$) that is approximately equal to the resistance of the resistor 310 times the capacitance of the capacitor 325. In example operations, adjusting the resistance of the resistor 310 modifies the time constant of the RC circuit of the resistor 310 and the capacitor 325, which modifies the rate at which the strap voltage increases and decreases. As shown in Equation (1), below, the strap pin voltage is approximately equal to a voltage of the capacitor 325, which as described below is the common collector voltage 360, times the constant e to the power of minus time over the time constant (−t/RC). Advantageously, adjusting the resistance of the resistor 310 modifies the rate at which the voltage of the first terminal of the capacitor 325 increases.

$$V_{STRAP} = V_{CC} * e^{\frac{-t}{RC}} \qquad \text{Equation (1)}$$

The peripheral circuitry 330 has a first terminal coupled to the diode 315 and the capacitor 320, a second terminal coupled to the capacitor 325 and the resistor 310, a third terminal coupled to the resistor 310 and the capacitor 320, and fourth and fifth terminals coupled to the connector 300. The peripheral circuitry 330 receives the supply voltage from the diode 315, the common potential and CAN BUS signals ($CAN_H$ and $CAN_L$) from the connector 300, and the voltage of the strap pin from the resistor 310 and the capacitor 325.

The comparator circuitry 335 has a first input coupled to the resistor 310 and the capacitor 325, a second input coupled to the threshold voltage 340, and an output coupled to the controller circuitry 350. The comparator circuitry 335 receives the strap pin voltage from the RC circuit of the resistor 310 and the capacitor 325. The comparator circuitry 335 receives the threshold voltage 340, which may be generated by a reference voltage supply (not illustrated). The comparator circuitry 335 compares the strap pin voltage to the threshold voltage 340. When the strap pin voltage is less than the threshold voltage 340, the comparator circuitry 335 generates a comparison output having a first state (e.g., a logical low, a logic zero, etc.). When the strap pin voltage is greater than or equal to the threshold voltage 340, the comparator circuitry 335 generates a comparison output having a second state (e.g., a logical high, a logic one, etc.). The comparator circuitry 335 supplies the comparison output to the controller circuitry 350.

The timer circuitry 345 has a first terminal coupled to the capacitor 325, a second terminal coupled to the comparator circuitry 335, and a third terminal coupled to the configuration determination circuitry 375. The timer circuitry 345 receives the comparison output from the comparator circuitry 335. In the example of FIG. 3, the timer circuitry 345 includes the controller circuitry 350, the switch circuitry 355, the common collector voltage 360, the counter circuitry 365, and the clock circuitry 370. The timer circuitry 345 supplies power to the capacitor 325 and supplies a counter value to the configuration determination circuitry 375. The counter value represents the time between supplying power to the capacitor 325 and the strap pin voltage being equal to the threshold voltage 340.

The controller circuitry 350 has an input coupled to the comparator circuitry 335, a first output coupled to the switch circuitry 355, and a second output coupled to the counter circuitry 365. The controller circuitry 350 receives the comparison output from the comparator circuitry 335. The controller circuitry 350 controls the switch circuitry 355 and the counter circuitry 365. The controller circuitry 350 closes the switch circuitry 355 to allow a power supply, which supplies the common collector voltage 360, to supply power to the capacitor 325. The controller circuitry 350 prevents the supply of power to the capacitor 325 by opening the switch circuitry 355. The controller circuitry 350 provides an enable signal (e.g., logic high) to the counter circuitry 365 at an enable input (EN) responsive to which the counter circuitry 365 counts cycles of a reference clock. The controller circuitry 350 provides a disable signal (e.g., logic low) to the counter circuitry 365 at the enable input responsive to which the counter circuitry 365 stops counting cycles of the reference clock.

In example operations, and responsive to a power up of the secondary device 305, the controller circuitry 350 closes the switch circuitry 355 and provides the enable signal to the counter circuitry 365. The strap pin voltage increases responsive to closing the switch circuitry 355. The counter circuitry 365 increments a counter value responsive to the enable signal. Once the comparison output of the comparator circuitry 335 indicates that the strap pin voltage is greater than or equal to the threshold voltage 340, the controller circuitry 350 removes the enable signal, responsive to which the counter circuitry 365 stops incrementing the counter value.

The switch circuitry 355 has a first terminal coupled to the capacitor 325, a second terminal coupled to the common collector voltage 360, and a control terminal coupled to the controller circuitry 350. The controller circuitry 350 controls the switch circuitry 355. When open, the switch circuitry 355 prevents a supply of power to the capacitor 325. When closed, the switch circuitry 355 supplies the common collector voltage 360 to the capacitor 325. In some examples, the common collector voltage 360 is a power supply that supplies power at a fixed voltage to the capacitor 325 when the switch circuitry 355 is closed. In such examples, the peripheral circuitry 330 includes additional circuitry to generate the common collector voltage 360 from the supply voltage. Advantageously, the controller circuitry 350 controls the supply of power to the capacitor 325 by controlling the switch circuitry 355.

In the example of FIG. 3, the switch circuitry 355 controls the supply of power to the capacitor 325 from a power source, which supplies the common collector voltage 360. In some examples, the controller circuitry 350 is directly coupled to the power source, which generates the common collector voltage 360. In such examples, the power source supplies power to the capacitor 325 using the common collector voltage 360 when the controller circuitry 350 generates an enable signal (e.g., a logic high) at an enable input of the power source. In other examples, the controller circuitry 350 is coupled to the power source by the switch circuitry 355. In such examples, the power source supplies power to the capacitor 325 responsive to the controller circuitry 350 closing the switch circuitry 355. Advantageously, a power source, which supplies the common collector voltage 360, may be internal or external to the timer circuitry 345.

The counter circuitry 365 has a first input coupled to the controller circuitry 350, a second input coupled to the clock circuitry 370, and an output coupled to the configuration determination circuitry 375. The counter circuitry 365 receives an enable signal from the controller circuitry 350 and a reference clock signal from the clock circuitry 370. The controller circuitry 350 controls the counter circuitry 365. Responsive to the enable signal from the controller circuitry 350, the counter circuitry 365 increments a count value responsive to a cycle of the reference clock. Responsive to the controller circuitry 350 removing the enable signal, the counter circuitry 365 no longer increments the count value. The counter circuitry 365 supplies the count value to the configuration determination circuitry 375. In example operations, when allowing power to be supplied the capacitor 325, the controller circuitry 350 provides the enable signal to the counter circuitry 365 to which the counter circuitry 365 counts cycles of the reference clock. In such example operations, when the strap pin voltage is approximately equal to the threshold voltage 340, the controller circuitry 350 provides the disable signal (e.g., a logical low at the EN terminal) to the counter circuitry 365 to which the counter circuitry stops counting.

The clock circuitry 370 is coupled to the counter circuitry 365. The clock circuitry 370 generates the reference clock signal. The reference clock signal is a periodic signal of a predetermined frequency. In some examples, the clock circuitry 370 is resistor-capacitor (RC) clock circuitry. In other examples, the clock circuitry 370 is oscillator circuitry, such as crystal oscillator circuitry. In some such examples, one or more components of the clock circuitry 370 are external to the peripheral circuitry 330, such as a crystal component of crystal oscillator circuitry. In yet another example, the clock circuitry 370 is a timer-controlled voltage ramp, which may ramp up or down.

The configuration determination circuitry 375 has a first input coupled to the counter circuitry 365, a second input coupled to the storage 380, and an output coupled to the configuration register 390. The configuration determination circuitry 375 receives the count value from the counter circuitry 365. The configuration determination circuitry 375 accesses the LUT 385 in the storage 380. The configuration determination circuitry 375 selects a configuration (e.g., an address, instruction set, etc.) that corresponds to the timing that the count value represents. For example, the configuration determination circuitry 375 selects a first configuration responsive to the count value being a first value and a second configuration responsive to the count value being a second value. In such an example, the first configuration corresponds to a first range of count values, which includes the first value, and the second configuration corresponds to a second range of count values, which includes the second value. The configuration determination circuitry 375 supplies the determined configuration to the configuration register 390. In some examples, the configuration determination circuitry 375 writes and/or stores the determined configuration in the configuration register 390.

The storage 380 is coupled to the configuration determination circuitry 375. In the example of FIG. 3, the storage 380 includes the LUT 385. The storage 380 is non-volatile memory that stores the LUT 385. The LUT 385 includes a plurality of values that each correspond to a configuration of the secondary device 305. Each configuration of the secondary device 305 corresponds to a range of count values that the configuration determination circuitry 375 uses to select the configuration. The value corresponding to each configuration, when stored in the configuration register 390, adjusts operations of the secondary device 305. For example, the secondary device 305 has a first address responsive to a first configuration or a second address responsive to a second configuration. In such examples, the first and/or second addresses correspond to codes that identify the secondary device 305 in a system, such as the vehicle 100.

The configuration register 390 is coupled to the configuration determination circuitry 375. The configuration register 390 receives the determined configuration from the configuration determination circuitry 375. The configuration register 390 is volatile memory, which stores the determined configuration. Advantageously, the configuration register 390 stores a configuration that is determined responsive to the time taken to charge the strap pin voltage to the threshold voltage 340. Advantageously, the configuration determination circuitry 375 stores a different configuration in the configuration register 390 responsive to changing the resistance of the resistor 310.

Although in the example of FIG. 3, the secondary device 305 uses the charge timing of an RC circuit, in some examples, the secondary device 305 may use the discharge timing of the RC circuit to select a device configuration. Such examples are described in connection with the flowchart of FIG. 8, below.

Figure 4:
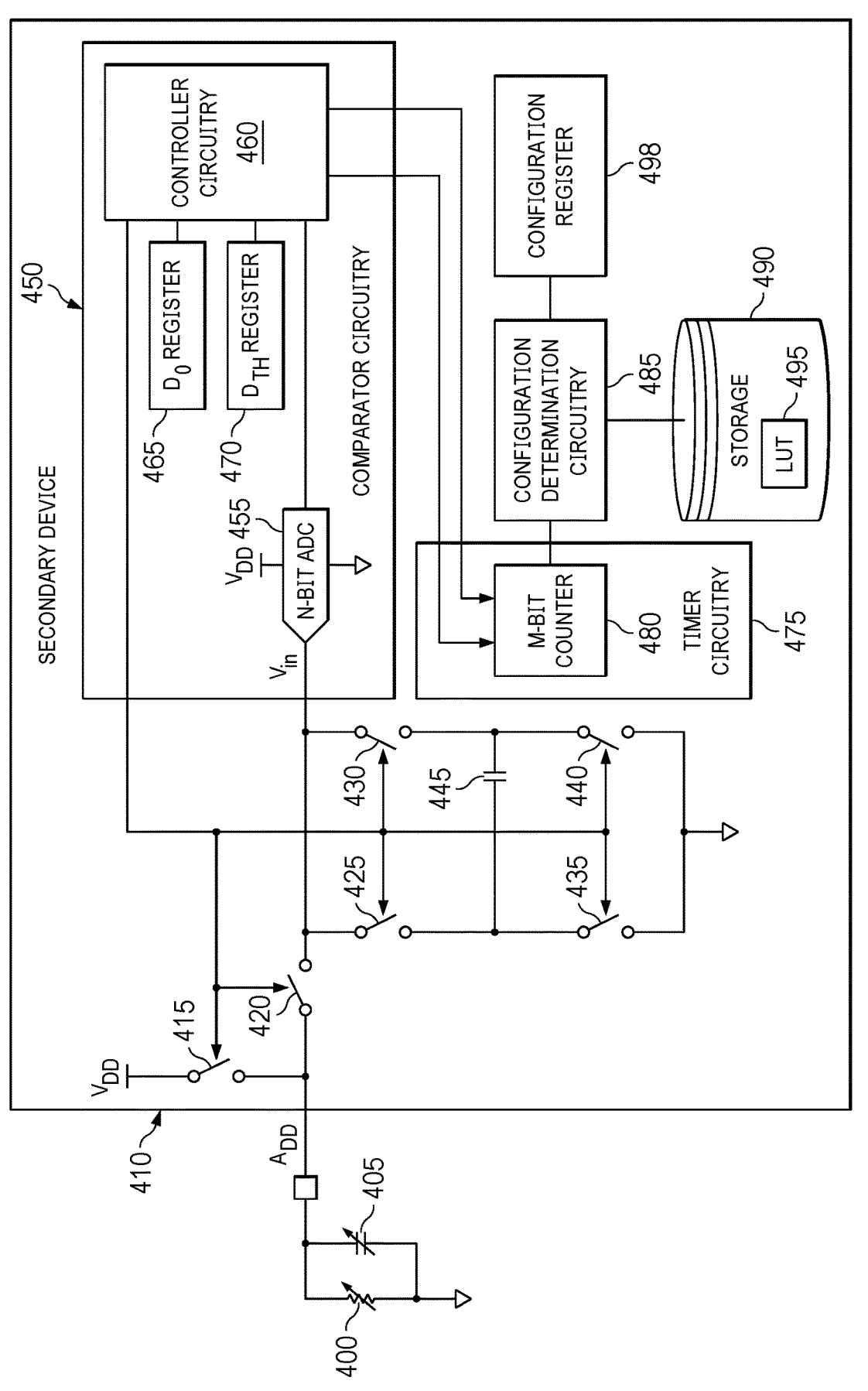
FIG. 4 is a schematic diagram of another example of the secondary device of FIGS. 1 and 2.

In the example of FIG. 3, the connector 300 provides a common potential to the secondary device 305. However, in some applications, secondary devices may have isolated common potentials. In such examples, common mode differences between a common mode of a connector may result in the secondary devices inaccurately determining the configuration responsive to differences in the common potential. FIG. 4 illustrates an example secondary device that includes circuitry to account for common mode differences between the secondary device and a connector. Also, FIG. 4 is another example of the secondary device 305, which uses an ADC to compare voltages of the RC circuit.

FIG. 4 is a schematic diagram of an example variable resistor 400, an example variable capacitor 405, and an example secondary device 410, which may represent any of the secondary devices of FIGS. 1 and 2. In the example of FIG. 4, the secondary device 410 has a first example switch circuitry 415, a second example switch circuitry 420, a third example switch circuitry 425, a fourth example switch circuitry 430, a fifth example switch circuitry 435, a sixth example switch circuitry 440, an example capacitor 445, example comparator circuitry 450, example timer circuitry 475, example configuration determination circuitry 485, an example storage 490, and an example configuration register 498. The comparator circuitry 450 includes an example analog-to-digital converter (ADC) 455, example controller circuitry 460, a first example register 465, and a second example register 470. The timer circuitry 475 includes example counter circuitry 480. The storage 490 includes an example look-up-table (LUT) 495. Alternatively, the secondary device 410 may include additional circuitry to perform one or more additional operations, such as circuitry to receive and/or transmit data using the CAN BUS signals and/or sensors to collect data to be transmitted.

The variable resistor 400 has a first terminal coupled to the variable capacitor 405 and the switch circuitry 415, 420 and a second terminal coupled to a common terminal, which supplies a common potential (e.g., ground). The variable capacitor 405 has a first terminal coupled to the variable resistor 400 and the switch circuitry 415, 420 and a second terminal coupled to the common terminal. The first terminals of the variable resistor 400 and the variable capacitor 405 are coupled to what may be referred to as a strap pin and/or a configuration pin (ADD) of the secondary device 410.

The variable resistor 400 and the variable capacitor 405 form an RC circuit, similar to the RC circuit of the resistor 310 of FIG. 3 and the capacitor 325 of FIG. 3. Variations in either the resistance of the variable resistor 400 or the capacitance of variable capacitor 405 adjust the charge and discharge rate of the strap pin of the secondary device 410. In some examples, the secondary device 410 charges the variable capacitor 405 until the voltage of the strap pin is greater than or equal to a reference voltage. In such examples, the secondary device 410 uses the time between the voltage of the strap pin being approximately equal to the reference voltage and the voltage of the strap pin being approximately equal to a threshold voltage to determine a configuration. Advantageously, the secondary device 410 utilizes both an external resistance and capacitance to determine a configuration.

The switch circuitry 415 has a first terminal coupled to a supply terminal, which supplies a supply voltage ($V_{DD}$), a second terminal coupled to the variable resistor 400, the variable capacitor 405, and the switch circuitry 420, and a control terminal coupled to the controller circuitry 460. The controller circuitry 460 controls the switch circuitry 415. When closed, the switch circuitry 415 supplies the supply voltage to the variable resistor 400 and the variable capacitor 405. When opened, the switch circuitry 415 prevents the supply of power to the variable resistor 400 and the variable capacitor 405.

The switch circuitry 420 has a first terminal coupled to the variable resistor 400, the variable capacitor 405, and the switch circuitry 420, a second terminal coupled to the switch circuitry 425, 430 and the ADC 455, and a control terminal coupled to the controller circuitry 460. The controller circuitry 460 controls the switch circuitry 420. When closed, the switch circuitry 420 couples the strap pin to the ADC 455. When opened, the switch circuitry 420 prevents the ADC 455 from sampling the voltage of the strap pin.

The switch circuitry 425 has a first terminal coupled to the switch circuitry 420, 430 and the ADC 455, a second terminal coupled to the switch circuitry 435 and the capacitor 445, and a control terminal coupled to the controller circuitry 460. The controller circuitry 460 controls the switch circuitry 425. When closed, the switch circuitry 425 couples the switch circuitry 435 and the capacitor 445 to the ADC 455. When opened, the switch circuitry 425 prevents the ADC 455 from sampling the capacitor 445.

The switch circuitry 430 has a first terminal coupled to the switch circuitry 420, 425 and the ADC 455, a second terminal coupled to the switch circuitry 440 and the capacitor 445, and a control terminal coupled to the controller circuitry 460. The controller circuitry 460 controls the switch circuitry 430. When closed, the switch circuitry 430 couples the switch circuitry 440 and the capacitor 445 to the ADC 455. When opened, the switch circuitry 430 prevents the ADC 455 from sampling the capacitor 445.

The switch circuitry 435 has a first terminal coupled to the switch circuitry 425 and the capacitor 445, a second terminal coupled to a common terminal, which supplies a common potential (e.g., ground), and a control terminal coupled to the controller circuitry 460. The controller circuitry 460 controls the switch circuitry 435. When closed, the switch circuitry 435 couples the capacitor 445 to the common terminal. When opened, the switch circuitry 435 prevents the capacitor 445 from being coupled to the common terminal.

The switch circuitry 440 has a first terminal coupled to the switch circuitry 430 and the capacitor 445, a second terminal coupled to the common terminal, and a control terminal coupled to the controller circuitry 460. The controller circuitry 460 controls the switch circuitry 440. When closed, the switch circuitry 440 couples the capacitor 445 to the common terminal. When opened, the switch circuitry 440 prevents the capacitor 445 from being coupled to the common terminal. In the example of FIG. 4, the switch circuitry 415, 420, 425, 430, 435, 440 are illustrated and described as switches. However, in some examples, the switch circuitry 415, 420, 425, 430, 435, 440 may be illustrated and/or described as transistors, which are controlled by the controller circuitry 460.

The capacitor 445 has a first terminal coupled to the switch circuitry 425, 435 and a second terminal coupled to the switch circuitry 430, 440. The comparator circuitry 450 uses the capacitor 445 to determine an input offset voltage ($V_{OS}$) at the strap pin. In the example of FIG. 4, the common terminal coupled to the variable resistor 400 and the variable capacitor 405 is isolated from the common terminal coupled to the switch circuitry 435, 440. In such an example, variations between the common potential supplied by either instance of the common terminal generates an offset voltage, which offsets voltages determined by the ADC 455. Advantageously, the controller circuitry 460 may determine the input offset voltage using the switch circuitry 415, 420, 425, 430, 435, 440 and the capacitor 445. Advantageously, the controller circuitry 460 increases the accuracy of voltage measurements at the strap pin by accounting for the input offset voltage.

In example operations to determine the input offset voltage, the controller circuitry 460 closes the switch circuitry 420, 425, 440, which couples variable resistor 400 and the variable capacitor 405 to the capacitor 445. The controller circuitry 460 allows the input offset voltage to charge the capacitor 445. Once the capacitor 445 is charged, the ADC 455 samples the voltage of the capacitor 445 to determine a digital value that represents the input offset voltage. The controller circuitry 460 compares the digital value representing the input offset voltage to the common potential.

When the controller circuitry 460 determines that the input offset voltage is greater than the common potential, the controller circuitry 460 adds the determined digital value of the input offset voltage to the value of the register 470. In such example operations, the controller circuitry 460 accounts for variations between the input offset voltage and the common potential of the secondary device 410 by adjusting the register 470. When the controller circuitry 460 determines that the input offset voltage is less than the common potential, the controller circuitry 460 opens the switch circuitry 425, 440 and closes the switch circuitry 430, 435 to switch circuitry the polarity of the capacitor 445. In such example operations, the input offset voltage at the strap pin charges the capacitor 445. When the controller circuitry 460 determines that the capacitor 445 is charged, the controller circuitry 460 subtracts the digital value, which represents the input offset voltage, from the value of the register 470. In such example operations, the controller circuitry 460 accounts for variations between the input offset voltage and the common potential of the secondary device 410 by adjusting the register 470. Advantageously, the controller circuitry 460 uses the switch circuitry 415, 420, 425, 430, 435, 440 and the capacitor 445 to determine and account for the input offset voltage at the strap pin.

The comparator circuitry 450 has an input coupled to the switch circuitry 420, 425, 430 and outputs coupled to the switch circuitry 415, 420, 425, 430, 435, 440, and the timer circuitry 475. In the example of FIG. 4, the comparator circuitry 450 includes the ADC 455, the controller circuitry 460, and the registers 465, 470. The ADC 455 samples the voltage of the strap pin, which is referred to as the strap pin voltage. The controller circuitry 460 compares a digital value representing the strap pin voltage to the reference values to the registers 465, 470. The controller circuitry 460 controls the timer circuitry 475 responsive to the comparison.

The ADC 455 has an input coupled to the switch circuitry 420, 425, 430 and an output coupled to the controller circuitry 460. The ADC 455 receives the strap pin voltage from the switch circuitry 420 and/or the input offset voltage from the switch circuitry 425, 430. The ADC 455 converts the analog value of the strap pin voltage or the input offset voltage into a digital output value ($D_{OUT}$), which represents the analog value. The ADC 455 supplies the digital output value to the controller circuitry 460.

The controller circuitry 460 has a first input terminal coupled to the ADC 455, a second input terminal coupled to the register 465, and a third input terminal coupled to the register 470. The controller circuitry 460 has a first and second output terminal coupled to the counter circuitry 480 and a plurality of output terminals coupled to the switch circuitry 415, 420, 425, 430, 435, 440. The controller circuitry 460 receives the digital output value from the ADC 455, a reference value from the register 465 and a threshold value from the register 470. The reference value corresponds to a reference voltage that when converted by ADC 455 generates a digital output value that is equal to the reference value. The threshold value corresponds to a threshold voltage that when converted by ADC 455 generates a digital output value that is equal to the threshold value. The controller circuitry 460 controls the switch circuitry 415, 420, 425, 430, 435, 440. As described above, the controller circuitry 460 sequences closing the switch circuitry 420, 425, 440 and/or 420, 430, 435 to receive a digital output value that represents the input offset voltage. When the input offset voltage is greater than zero, the controller circuitry 460 adds the input offset voltage to the threshold voltage. When the input offset voltage is less than zero, the controller circuitry 460 subtracts the input offset voltage from the threshold voltage. Advantageously, the input offset voltage at the strap pin represents a difference between common potentials of the secondary device 410 and the variable resistor 400 and the variable capacitor 405. Advantageously, the controller circuitry 460 accounts for differences between a first common potential of the variable resistor 400 and the variable capacitor 405 and a second common potential of the secondary device 410 by adjusting the threshold value.

The controller circuitry 460 controls the counter circuitry 480 by generating an enable signal and a disable signal. The controller circuitry 460 supplies the enable signal to the counter circuitry 480 to which the counter circuitry 480 starts incrementing a count value to count cycles of a reference clock. The controller circuitry 460 supplies the disable signal to the counter circuitry 480 to which the counter circuitry 480 stops incrementing the count value. The counter circuitry 480 sets the count value to an initial value responsive to the controller circuitry 460 supplying a reset signal.

In example operations to determine a configuration of the secondary device 410, the controller circuitry 460 closes the switch circuitry 415, 420, responsive to which the variable capacitor 405 charges. The controller circuitry 460 supplies the reset signal to the counter circuitry 480 to which the counter circuitry 480 resets the count value to an initial value. The ADC 455 supplies digital output values representing the strap pin voltage to the controller circuitry 460 responsive to the switch circuitry 420 being closed. The controller circuitry 460 compares the digital output values to the reference value from the register 465. When the controller circuitry 460 determines that a digital output value from the ADC 455 represents a strap pin voltage that is approximately equal to the threshold voltage, the controller circuitry 460 opens the switch circuitry 415 and enables the counter circuitry 480. The controller circuitry 460 compares the digital output values from the ADC 455 to the threshold value of the register 470. When the controller circuitry 460 determines that a digital output value from the ADC 455 is approximately equal to the threshold value, the controller circuitry 460 disables the counter circuitry 480. In such example operations, the counter circuitry 480 generates a count value that represents an amount of time needed for the strap pin voltage to decrease from the reference voltage to the threshold voltage. Advantageously, variations in the resistance of the variable resistor 400 or the capacitance of the variable capacitor 405 adjust the rate at which the strap pin voltage decreases to the threshold voltage.

The timer circuitry 475 has a first input terminal and a second input terminal coupled to the controller circuitry 460 and an output terminal coupled to the configuration determination circuitry 485. The controller circuitry 460 controls the timer circuitry 475. In the example of FIG. 4, the timer circuitry 475 includes the counter circuitry 480. Alternatively, the timer circuitry 475 may include additional circuitry, such as the clock circuitry 370 of FIG. 3. The timer circuitry 475 generates a count value. The timer circuitry 475 supplies the count value to the configuration determination circuitry 485.

The counter circuitry 480 has a first and second input coupled to the controller circuitry 460 and an output coupled to the configuration determination circuitry 485. The counter circuitry 480 receives the enable signal, the disable signal, and the reset signal from the controller circuitry 460. The controller circuitry 460 controls the counter circuitry 480. When the controller circuitry 460 supplies the enable signal, the counter circuitry 480 increments a count value responsive to a cycle of a reference clock. When the controller circuitry 460 supplies the disable signal, the counter circuitry 480 no longer increments the count value. The counter circuitry 480 supplies the count value to the configuration determination circuitry 485. In example operations, the controller circuitry 460 supplies the enable signal to the counter circuitry 480 to which the counter circuitry 480 starts counting responsive to the strap pin voltage being approximately equal to the reference voltage of the register 465. In such example operations, the controller circuitry 460 supplies the disable signal to the counter circuitry 480 to which the counter circuitry 480 stops counting. In some examples, the controller circuitry 460 modifies the threshold voltage to account for the input offset voltage.

The configuration determination circuitry 485 has a first input coupled to the counter circuitry 480, a second input coupled to the storage 490, and an output coupled to the configuration register 498. The configuration determination circuitry 485 receives the count value from the counter circuitry 480. The configuration determination circuitry 485 accesses the LUT 495 in the storage 490. The configuration determination circuitry 485 selects a configuration that corresponds to the timing that the count value represents. For example, the configuration determination circuitry 485 selects a first configuration responsive to the count value being a first value and a second configuration responsive to the count value being a second value. In such an example, the first configuration corresponds to a first range of count values, which includes the first value, and the second configuration corresponds to a second range of count values, which includes the second value. The configuration determination circuitry 485 supplies the determined configuration to the configuration register 498. In some examples, the configuration determination circuitry 485 writes and/or stores the determined configuration in the configuration register 498.

The storage 490 is coupled to the configuration determination circuitry 485. In the example of FIG. 4, the storage 490 includes the LUT 495. The storage 490 is non-volatile memory that stores the LUT 495. The LUT 495 includes a plurality of values that each correspond to a configuration of the secondary device 410. Each configuration of the secondary device 410 corresponds to a range of count values that the configuration determination circuitry 485 uses to select the configuration. The value corresponding to each configuration, when stored in the configuration register 498, adjusts operations of the secondary device 410. For example, the secondary device 410 has a first address responsive to a first configuration or a second address responsive to a second configuration. In such examples, the first and/or second addresses correspond to codes that identify the secondary device 410 in a system, such as the vehicle 100.

The configuration register 498 is coupled to the configuration determination circuitry 485. The configuration register 498 receives the determined configuration from the configuration determination circuitry 485. The configuration register 498 is volatile memory, which stores the determined configuration. Advantageously, the configuration register 498 stores a configuration that is determined responsive to the time taken to charge the strap pin voltage to the threshold voltage. Advantageously, the configuration determination circuitry 485 stores a different configuration in the configuration register 498 responsive to changing the resistance of the variable resistor 400 or the capacitance of the variable capacitor 405.

Although in the example of FIG. 4, the secondary device 410 uses the discharge timing of an RC circuit, in some examples, similar to the secondary device 305, the secondary device 410 may use the charge timing of the RC circuit to select a device configuration. Such examples are described in connection with the flowchart of FIG. 7, below.

Figure 5:
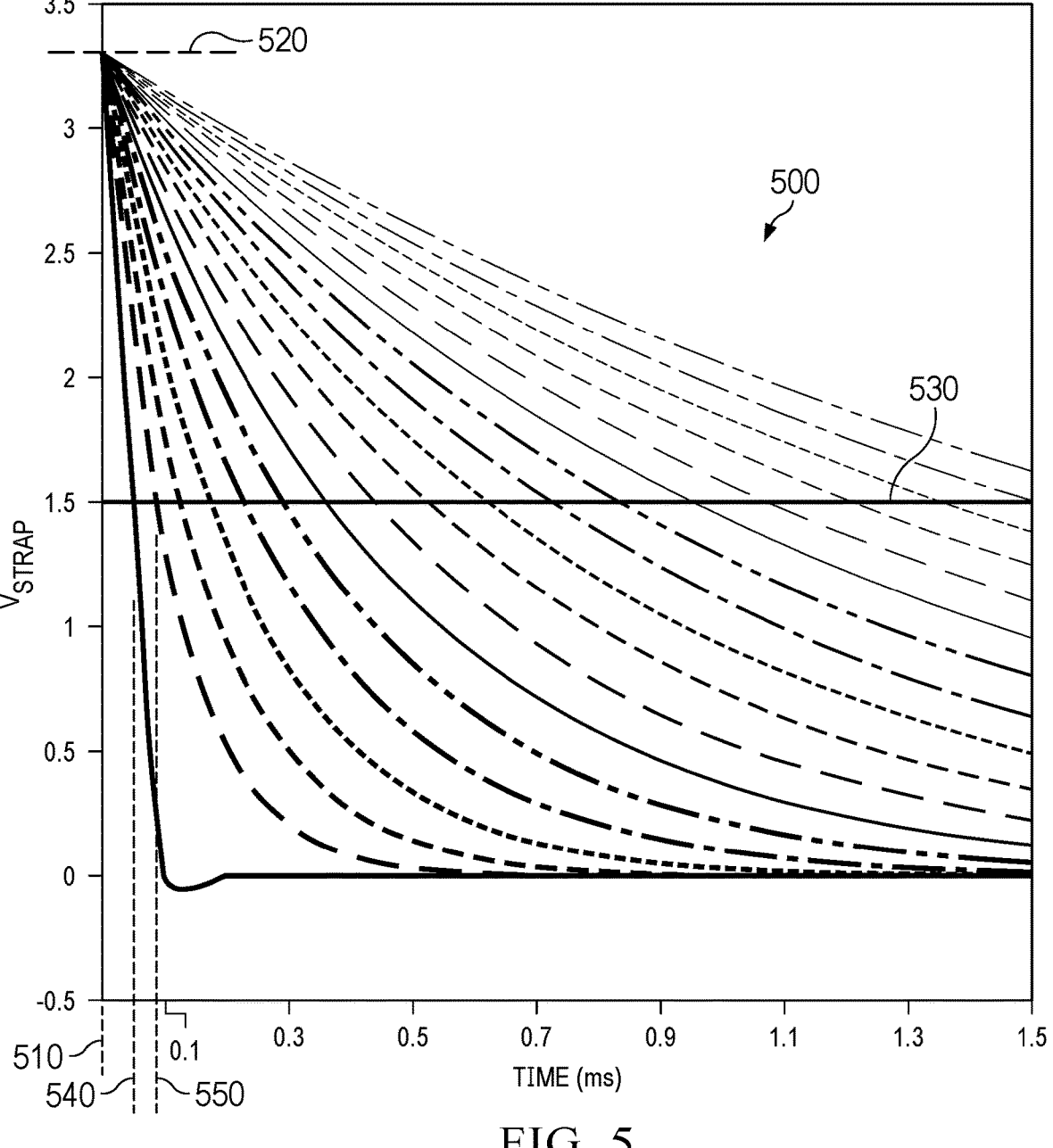
FIG. 5 is a timing diagram of example operations of the secondary devices of FIGS. 1, 2, 3, and 4 to determine a configuration in the communication system using a timing characteristic.

FIG. 5 is a timing diagram 500 of example operations of the secondary devices 305, 410 of FIGS. 3 and 4 to determine a configuration responsive to a change in the strap pin voltage over time. In the example of FIG. 5, the timing diagram 500 illustrates a plurality of possible charge and/or discharge rates of the RC circuits coupled to the strap pins of the secondary devices 305, 410. For example, the RC circuit of the resistor 310 of FIG. 3 and the capacitor 325 of FIG. 3 or the RC circuit of the variable resistor 400 of FIG. 4 and the variable capacitor 405 of FIG. 4.

At a first example time 510, the strap pin voltage starts at an initial voltage 520. In some examples, such as FIG. 3, the initial voltage 520 corresponds to the RC circuit being discharged. In such an example, the initial voltage 520 is a common potential (e.g., ground or zero volts). In other examples, such as FIG. 4, the initial voltage 520 corresponds to the RC circuit being charged to a reference voltage (e.g., the voltage corresponding to the reference value of the register 465 of FIG. 4). In such examples, the initial voltage 520 is a voltage greater than the common potential.

At the first time 510, the secondary devices 305, 410 start incrementing a counter value. After the first time 510, the secondary devices 305, 410 allow the RC circuit to charge, such as in the example of FIG. 3, or discharge, such as in the example of FIG. 4. After the first time 510, the secondary devices 305, 410 compare the strap pin voltage to an example threshold voltage 530. The threshold voltage 530 represents a threshold value, such as the threshold voltage 340 of FIG. 3 or the threshold value of the register 470 of FIG. 4.

Once the strap pin voltage is approximately equal to the threshold voltage 530, the secondary devices 305, 410 stop incrementing the count value to generate a value that represents the time needed to charge or discharge from the initial voltage 520 to the threshold voltage 530. For example, when the resistor 310 or the variable resistor 400 has a first resistance and the capacitor 325 or the variable capacitor 405 has a first capacitance, the count value represents a second time 540. In such an example, when the resistor 310 or the variable resistor 400 has a second resistance and the capacitor 325 or the variable capacitor 405 has a second capacitance, the count value represents a third time 550. Advantageously, adjusting the resistance of the resistor 310 or the variable resistor 400 and/or the capacitance of the capacitor 325 or the variable capacitor 405 modifies the determined count value to represent a different time. Advantageously, the secondary devices 305, 410 may select between one of a plurality of different device configurations and/or addresses responsive to the variations in either of the resistors 310, 400 or the capacitors 325, 405.

Figure 6:
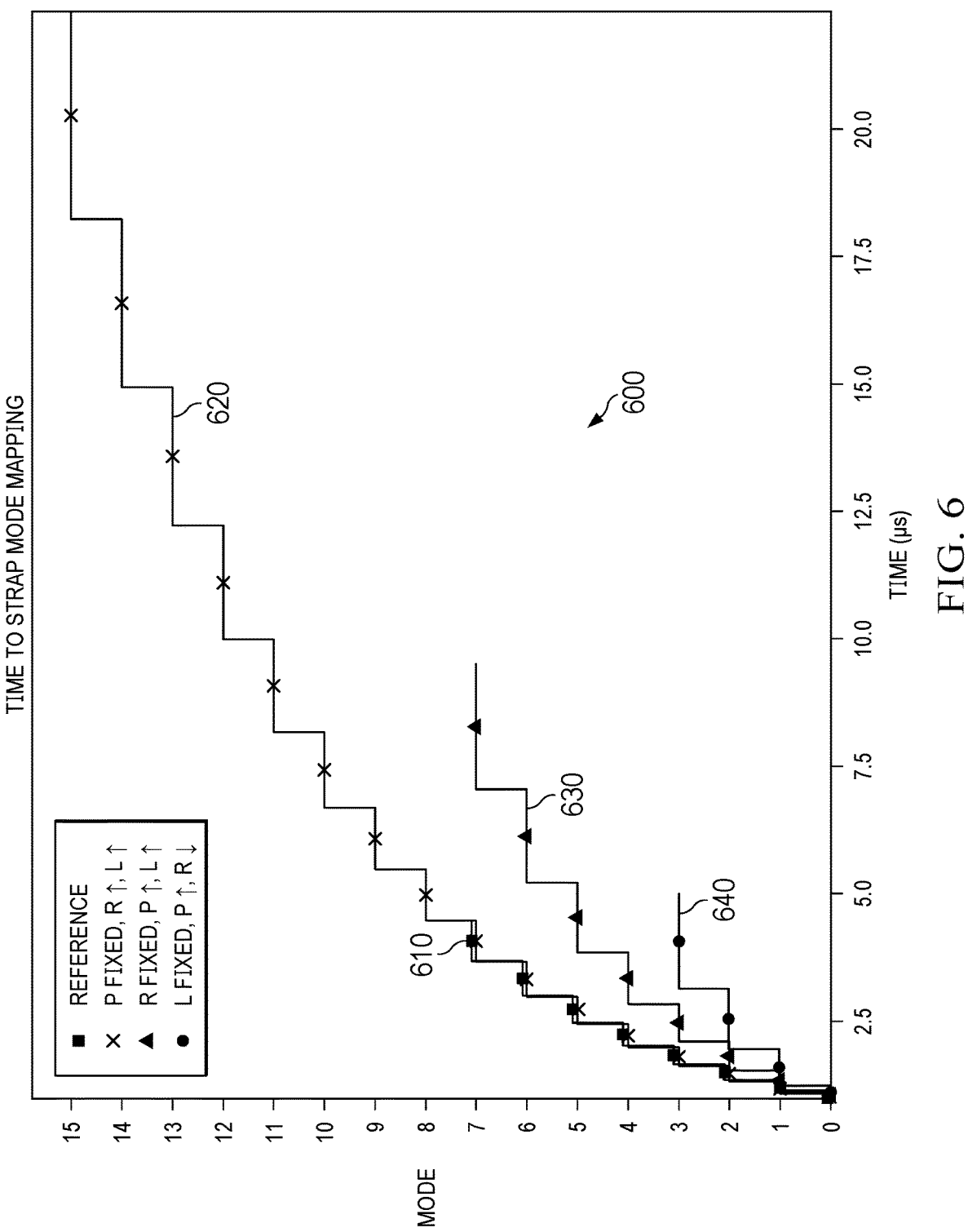
FIG. 6 is a timing diagram of example operations of the secondary devices of FIGS. 1, 2, 3, and 4.

FIG. 6 is a timing diagram 600 of example operations of the secondary devices 305, 410 of FIGS. 3 and 4, which may be implemented in a system, such as the secondary devices 125, 135, 145, 155, 165, 175 of FIGS. 1 and 2 are in the vehicle 100. The timing diagram 600 illustrates timings for unique configurations of the secondary devices 305, 410 across different precisions, latencies, and resolutions. In the example of FIG. 6, the timing diagram 600 includes first example conditions 610, second example conditions 620, third example conditions 630, and fourth example conditions 640. When implementing the secondary devices 305, 410, designers may modify component values to adjust the precision, latency, and resolution of the timer circuitry 345, 475 of FIGS. 3 and 4. Such modifications to components may be responsive to bill of materials (BOM) costs, sources of error, etc. The conditions 610, 620, 630, 640 illustrate different conditions that designers may use to implement the secondary devices 305, 410.

The conditions 610 represent reference conditions. During the conditions 610 the secondary devices 305, 410 have a ten percent precision (P) and approximately a four microsecond latency (L) for eight possible configurations. During the conditions 620 the secondary devices 305, 410 have a ten percent precision and approximately a twenty micro-second latency for sixteen possible configurations. During the conditions 630 the secondary devices 305, 410 have a fifteen percent precision and approximately an eight micro-second latency for eight possible configurations. During the conditions 640 the secondary devices 305, 410 have a twenty-three percent precision and approximately a four microsecond latency for four possible configurations.

In example operations, designers may implement the secondary devices 305, 410 using one of the conditions 610, 620, 630, 640. In such examples, designers may use resistances that correspond to longer times responsive to the non-linear nature of the modes. For example, using a resistance that generates a time between fifteen and eighteen microseconds has a higher likelihood of accurate configuration detection, than using a resistance that generates a time between eight and ten micro seconds. When implementing the secondary devices 305, 410, designers may account for component tolerances by using timings that have relatively larger durations.

Figure 7:
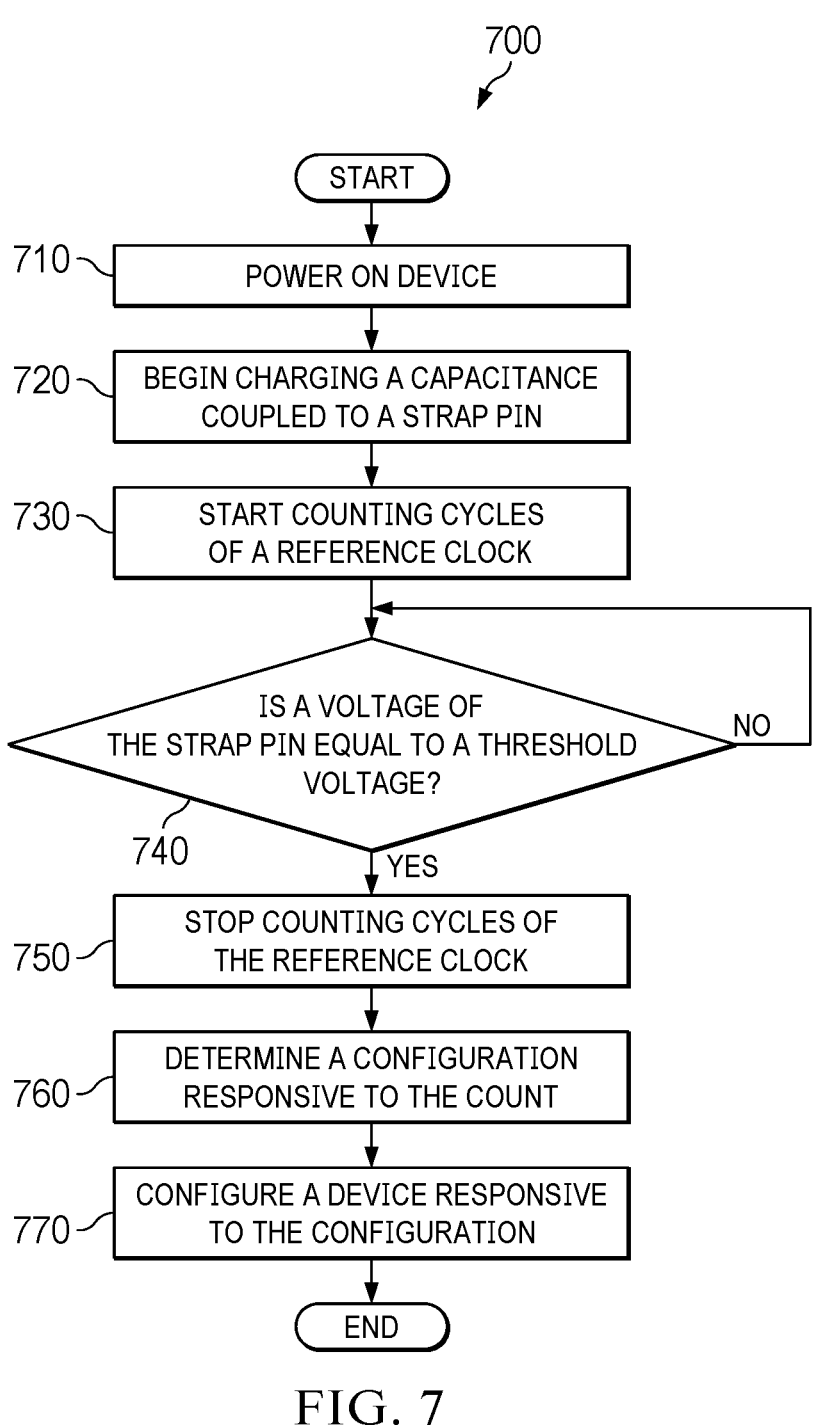
FIG. 7 is a flowchart of example operations that may be executed, instantiated, and/or performed to implement the secondary device of FIG. 3, and/or to use the charging time of an RC circuit to determine a configuration.

FIG. 7 is a flowchart of example operations 700 that may be executed, instantiated, and/or performed to implement the secondary device 305 of FIG. 3, when using the charging time of an RC circuit to determine a configuration. The example operations 700 begin at Block 710, at which, the secondary device 305 is powered on. In some examples, the secondary device 305 is coupled to external circuitry, such as the connector 300 of FIG. 3. In such examples, the secondary device 305 receives a supply voltage ($V_{SUPP}$) from the connector 300.

The controller circuitry 350 of FIG. 3 charges a capacitor coupled to a strap pin. (Block 720). In some examples, the controller circuitry 350 closes the switch circuitry 355 of FIG. 3, which supplies the common collector voltage 360 of FIG. 3 to the capacitor 325 of FIG. 3. In such examples, the switch circuitry 355 allows the capacitor 325 to be charged by the power supply that supplies the common collector voltage 360.

The counter circuitry 365 of FIG. 3 starts counting cycles of a reference clock. (Block 730). In some examples, the controller circuitry 350 closes the switch circuitry 355 and enables the counter circuitry 365 at approximately the same time. In such examples, the counter circuitry 365 increments a count value for each cycle of a reference clock.

The comparator circuitry 335 of FIG. 3 determines if the voltage of the strap pin is equal to a threshold voltage. (Block 740). In some examples, the comparator circuitry 335 compares the strap pin voltage ($A_{DD}$ or $V_{STRAP}$) to the threshold voltage 340 of FIG. 3. If the comparator circuitry 335 determines that the voltage of the strap pin is not equal to the threshold voltage (e.g., Block 740 returns a result of NO), control proceeds to return to Block 740.

If the comparator circuitry 335 determines that the voltage of the strap pin is equal to the threshold voltage (e.g., Block 740 returns a result of YES), the counter circuitry 365 stops counting cycles of the reference clock. (Block 750). In some examples, the controller circuitry 350 disables the counter circuitry 365 responsive to determining that the comparison output of the comparator circuitry 335 represents that the strap pin voltage is greater than or equal to the threshold voltage 340.

The configuration determination circuitry 375 of FIG. 3 determines a configuration responsive to the count. (Block 760). In some examples, the configuration determination circuitry 375 selects a configuration from the LUT 385 of FIG. 3 responsive to the count value from the counter circuitry 365. In such examples, the configuration from the LUT 385 corresponds to a range of possible count values, which includes the determined count value and corresponds to the configuration.

The configuration register 390 of FIG. 3 configures a device responsive to the configuration. (Block 770). In some examples, the configuration determination circuitry 375 stores the configuration or a value that represents the configuration in the configuration register 390. In such examples, the configuration register 390 adjusts the operations of the secondary device 305 to implement the configuration. Control proceeds to end.

Although example methods are described with reference to the flowchart illustrated in FIG. 7, many other methods of implementing the secondary device 305 may alternatively be used in this description. For example, the order of execution of the blocks may be changed, and/or some of the blocks described may be changed, eliminated, or combined. Similarly, additional operations may be included in the manufacturing process before, in between, or after the blocks shown in the illustrated examples.

Figure 8:
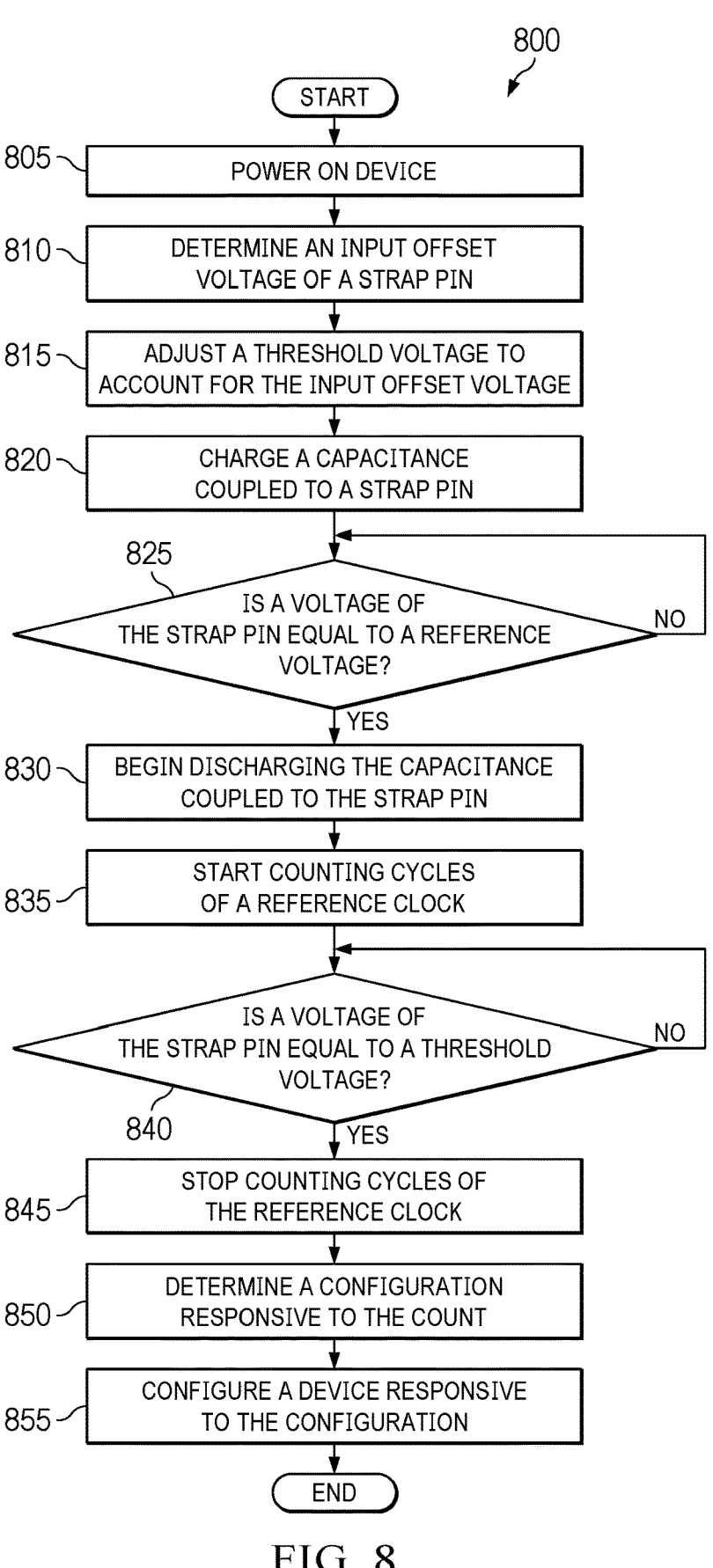
FIG. 8 is a flowchart of example operations that may be executed, instantiated, and/or performed to implement the secondary devices of FIG. 4, and/or to use the discharging time of an RC circuit to determine a configuration.

FIG. 8 is a flowchart of example operations 800 that may be executed, instantiated, and/or performed to implement the secondary device 410 of FIG. 4, when using the discharging time of an RC circuit to determine a configuration. The example operations 800 begin at Block 805, at which, the secondary device 410 is powered on. In some examples, the secondary device 410 is supplied power by a power supply, such as a battery.

The controller circuitry 460 of FIG. 4 determines an input offset voltage of a strap pin. (Block 810). In some examples, the controller circuitry 460 opens the switch circuitry 415, 430, 435 of FIG. 4 and closes the switch circuitry 420, 425, 440 of FIG. 4. In such examples, the capacitor 445 of FIG. 4 charges to a voltage approximately equal to the input offset voltage. The ADC 455 of FIG. 4 supplies a digital output value that represents the input offset voltage to the controller circuitry 460. When the controller circuitry 460 determines that the input offset voltage is less than the voltage of the common potential (e.g., less than zero), the controller circuitry 460 opens the switch circuitry 415, 425, 440 and closes the switch circuitry 420, 430, 435 to switch circuitry the polarity of the capacitor 445. After such operations, the digital output value from the ADC 455 is a positive value.

The controller circuitry 460 adjusts a threshold voltage to account for the input offset voltage. (Block 815). In some examples, the controller circuitry 460 adds or subtracts the digital output value that represents the input offset voltage from the threshold value of the register 470 of FIG. 4. For example, when the input offset voltage is greater than the common potential of the secondary device 410, the controller circuitry 460 adds the reference value and the digital output value to account for the input offset voltage. In another example, when the input offset voltage is less than the common potential of the secondary device 410, the controller circuitry 460 subtracts the reference value and the digital output value to account for the input offset voltage.

The switch circuitry 415 charges a capacitor coupled to a strap pin. (Block 820). In some examples, the controller circuitry 460 charges the variable capacitor 405 of FIG. 4 responsive to opening the switch circuitry 425, 430, 435, 440 and closing the switch circuitry 415, 420. In such examples, the switch circuitry 415 allows the supply terminal to charge the variable capacitor 405.

The controller circuitry 460 determines if the voltage of the strap pin is equal to a reference voltage. (Block 825). In some examples, the controller circuitry 460 compares digital output values from the ADC 455 to the reference value of the register 465 of FIG. 4 responsive to closing the switch circuitry 415. If the controller circuitry 460 determines that the voltage at the strap pin is not equal to the reference voltage (e.g., Block 825 returns a result of NO), control proceeds to return to Block 825.

If the controller circuitry 460 determines that the voltage at the strap pin is equal to the reference voltage (e.g., Block 825 returns a result of YES), the switch circuitry 415 discharges the capacitance coupled to the strap pin. (Block 830). In some examples, the controller circuitry 460 allows the variable capacitor 405 to discharge by opening the switch circuitry 415.

The counter circuitry 480 of FIG. 4 starts counting cycles of a reference clock. (Block 835). In some examples, the controller circuitry 460 opens the switch circuitry 415 and enables the counter circuitry 480 at approximately the same time. In such examples, the counter circuitry 480 increments a count value by for each cycle of a reference clock.

The controller circuitry 460 determines if the voltage of the strap pin is equal to a reference voltage. (Block 840). In some examples, the controller circuitry 460 compares a digital output value from the ADC 455, which represents the strap pin voltage ($A_{DD}$ or $V_{STRAP}$), to the threshold value of the register 470. If the controller circuitry 460 determines that the voltage of the strap pin is not equal to the threshold voltage (e.g., Block 840 returns a result of NO), control proceeds to return to Block 840.

If the controller circuitry 460 determines that the voltage of the strap pin is equal to the threshold voltage (e.g., Block 840 returns a result of YES), the counter circuitry 480 stops counting cycles of the reference clock. (Block 845). In some examples, the controller circuitry 460 disables the counter circuitry 480 responsive to determining that the digital output value of the ADC 455 represents that the strap pin voltage is greater than or equal to the reference value of the register 470.

The configuration determination circuitry 485 of FIG. 4 determines a configuration responsive to the count. (Block 850). In some examples, the configuration determination circuitry 485 selects a configuration from the LUT 495 of FIG. 4 responsive to the count value from the counter circuitry 480. In such examples, the configuration from the LUT 495 corresponds to a range of possible count values, which includes the determined count value and corresponds to the configuration.

The configuration register 498 of FIG. 4 configures a device responsive to the configuration. (Block 855). In some examples, the configuration determination circuitry 485 stores the configuration or a value that represents the configuration in the configuration register 498. In such examples, the configuration register 498 adjusts the operations of the secondary device 410 to implement the configuration. Control proceeds to end.

Although example methods are described with reference to the flowchart illustrated in FIG. 8, many other methods of implementing the secondary device 410 may alternatively be used in this description. For example, the order of execution of the blocks may be changed, and/or some of the blocks described may be changed, eliminated, or combined. Similarly, additional operations may be included in the manufacturing process before, in between, or after the blocks shown in the illustrated examples.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" refers to implementations including any of (1) at least one A, (2) at least one B, or (3) at least one A and at least one B. Similarly, as used herein in the context of describing structures, components, items, objects and/or things, the phrase "at least one of A or B" refers to implementations including any of (1) at least one A, (2) at least one B, or (3) at least one A and at least one B. As used herein in the context of describing the performance or execution of processes, instructions, actions, activities, etc., the phrase "at least one of A and B" refers to implementations including any of (1) at least one A, (2) at least one B, or (3) at least one A and at least one B. Similarly, as used herein in the context of describing the performance or execution of processes, instructions, actions, activities, etc., the phrase "at least one of A or B" refers to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is not feasible and/or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections. For example, "approximately" and "about" may indicate such dimensions may be within a tolerance range of +/−10% unless otherwise specified herein.

As used herein "substantially real time" refers to occurrence in a near instantaneous manner recognizing there may be real world delays for computing time, transmission, etc. Thus, unless otherwise specified, "substantially real time" refers to real time+1 second.

As used herein, the phrase "in communication," including variations thereof, encompasses direct communication and/or indirect communication through one or more intermediary components, and does not require direct physical (e.g., wired) communication and/or constant communication, but rather also includes selective communication at periodic intervals, scheduled intervals, aperiodic intervals, and/or one-time events.

As used herein, "programmable circuitry" is defined to include (i) one or more special purpose electrical circuits (e.g., an application specific circuit (ASIC)) structured to perform specific operation(s) and including one or more semiconductor-based logic devices (e.g., electrical hardware implemented by one or more transistors), and/or (ii) one or more general purpose semiconductor-based electrical circuits programmable with instructions to perform specific functions(s) and/or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations and/or functions, Field Programmable Gate Arrays (FPGAs) that may be programmed with second instructions to cause configuration and/or structuring of the FPGAs to instantiate one or more operations and/or functions corresponding to the first instructions, Graphics Processor Units (GPUs) that may execute first instructions to perform one or more operations and/or functions, Digital Signal Processors (DSPs) that may execute first instructions to perform one or more operations and/or functions, XPUs, Network Processing Units (NPUs) one or more microcontrollers that may execute first instructions to perform one or more operations and/or functions and/or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and/or any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example, an integrated circuit may be implemented as one or more of an ASIC, an FPGA, a chip, a microchip, programmable circuitry, a semiconductor substrate coupling multiple circuit elements, a system on chip (SoC), etc.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Numerical identifiers such as "first," "second," "third," etc. are used merely to distinguish between elements of substantially the same type in terms of structure and/or function. These identifiers, as used in the detailed description, do not necessarily align with those used in the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero.

What is claimed is:

1. An apparatus comprising:

a capacitor having a terminal;

comparator circuitry having an input terminal and an output terminal, the input terminal of the comparator circuitry coupled to the terminal of the capacitor;

timer circuitry having an input terminal and an output terminal, the input terminal of the timer circuitry coupled to the output terminal of the comparator circuitry; and configuration determination circuitry having an input and an output, the input of the configuration determination circuitry coupled to the output of the timer circuitry; and a configuration register having an input coupled to the output of the configuration determination circuitry.

2. The apparatus of claim 1, further comprising connector including a resistor having a terminal coupled to the terminal of the capacitor and the input terminal of the comparator circuitry.

3. The apparatus of claim 1, wherein the terminal of the capacitor is a first terminal, the capacitor further having a second terminal, the timer circuitry includes:

switch circuitry having a first terminal, a second terminal, and a control terminal, the first terminal of the switch circuitry coupled to a supply voltage, the second terminal of the switch circuitry coupled to the second terminal of the capacitor;

controller circuitry having an input terminal, a first output terminal, and a second output terminal, the input terminal of the controller circuitry coupled to the output terminal of the comparator circuitry, the first output terminal of the controller circuitry coupled to the control terminal of the switch circuitry; and counter circuitry having an input terminal and an output terminal, the input terminal of the counter circuitry coupled to the second output terminal of the controller circuitry.

4. The apparatus of claim 1, wherein the input terminal of the configuration determination circuitry is a first input terminal, the configuration determination circuitry further having a second input terminal, the apparatus further comprising a look up table (LUT) having an output terminal coupled to the second input terminal of the configuration determination circuitry.

5. The apparatus of claim 1, further comprising switch circuitry having a first terminal and a second terminal, the first terminal of the switch circuitry coupled to the terminal of the capacitor, the second terminal of the switch circuitry coupled to the input terminal of the comparator circuitry.

6. The apparatus of claim 1, wherein the comparator circuitry includes:

an analog-to-digital converter (ADC) having an input terminal and an output terminal, the input terminal of the ADC coupled to the terminal of the capacitor; and controller circuitry having an input terminal and an output terminal, the input terminal of the controller circuitry coupled to the output of the ADC, the output terminal of the controller circuitry coupled to the input of the timer circuitry.

7. The apparatus of claim 6, wherein the timer circuitry is counter circuitry having an input terminal and an output terminal, the input terminal of the counter circuitry coupled to the output of the controller circuitry.

8. A device comprising:

peripheral circuitry including:

a capacitor having a terminal;

comparator circuitry having an input terminal and an output terminal, the input terminal of the comparator circuitry coupled to the terminal of the capacitor; and timer circuitry having an input terminal coupled to the output terminal of the comparator circuitry; and a connector including a resistor having a terminal coupled to the terminal of the capacitor and the input terminal of the comparator circuitry;

wherein the comparator circuitry includes:

an analog-to-digital converter (ADC) having an input terminal and an output terminal, the input terminal of the ADC coupled to the terminal of the capacitor; and controller circuitry having an input terminal and an output terminal, the input terminal of the controller circuitry coupled to the output terminal of the ADC, the output terminal of the controller circuitry coupled to the input terminal of the timer circuitry.

9. The device of claim 8, wherein the timer circuitry further has an output terminal, and the peripheral circuitry further includes a configuration determination circuitry having an input terminal coupled to the output terminal of the timer circuitry.

10. A device comprising:

first peripheral circuitry including:

a capacitor having a terminal;

comparator circuitry having an input terminal and an output terminal, the input terminal of the comparator circuitry coupled to the terminal of the capacitor; and timer circuitry having an input terminal coupled to the output terminal of the comparator circuitry; and a first connector including a resistor having a terminal coupled to the terminal of the capacitor and the input terminal of the comparator circuitry;

second peripheral circuitry having an input terminal, the second peripheral circuitry being another instance of the first peripheral circuitry;

a second connector having an output terminal coupled to the input terminal of the second peripheral circuitry; and a primary device having an output coupled to the first peripheral circuitry by the first connector and the second peripheral circuitry by the second connector.

11. A device comprising:

peripheral circuitry including:

a capacitor having a terminal;

comparator circuitry having an input terminal and an output terminal, the input terminal of the comparator circuitry coupled to the terminal of the capacitor;

timer circuitry having input and output terminals, the input terminal of the timer circuitry coupled to the output terminal of the comparator circuitry; and configuration determination circuitry having a first input terminal and a second input terminal, wherein the first input terminal coupled to the output terminal of the timer circuitry;

a connector including a resistor having a terminal coupled to the terminal of the capacitor and the input terminal of the comparator circuitry; and a look up table (LUT) having an output terminal coupled to the second input terminal of the configuration determination circuitry.

12. A device comprising:

peripheral circuitry including:

a capacitor having a first terminal;

comparator circuitry having an input terminal and an output terminal, the input terminal of the comparator circuitry coupled to the terminal of the capacitor; and timer circuitry having an input terminal coupled to the output terminal of the comparator circuitry; and a connector including a resistor having a terminal coupled to the terminal of the capacitor and the input terminal of the comparator circuitry, the timer circuitry further including:

switch circuitry having a first terminal, a second terminal, and a control terminal, the first terminal of the switch circuitry coupled to the second terminal of the capacitor, the second terminal of the switch circuitry coupled to a supply voltage;

controller circuitry having an input terminal, a first output terminal, and a second output terminal, the input terminal of the controller circuitry coupled to the output terminal of the comparator circuitry, the first output terminal of the controller circuitry coupled to the control terminal of the switch circuitry; and counter circuitry having an input terminal and an output terminal, the input terminal of the counter circuitry coupled to the second output terminal of the controller circuitry.

13. A device comprising:

peripheral circuitry including:

a capacitor having a terminal;

comparator circuitry having an input terminal and an output terminal, the input terminal of the comparator circuitry coupled to the terminal of the capacitor; and counter circuitry having an input terminal and an output terminal, the input terminal of the counter circuitry coupled to the output terminal of the comparator circuitry;

a connector including a resistor having a terminal coupled to the terminal of the capacitor and the input terminal of the comparator circuitry; and configuration determination circuitry having an input coupled to the output terminal of the counter circuitry.

14. The device of claim 13, wherein the comparator circuitry includes:

an analog-to-digital converter (ADC) having an input terminal and an output terminal, the input terminal of the ADC coupled to the terminal of the capacitor; and controller circuitry having an input terminal and an output terminal, the input terminal of the controller circuitry coupled to the output terminal of the ADC, the output terminal of the controller circuitry coupled to the input terminal of the counter circuitry.

15. An apparatus comprising:

a capacitor;

comparator circuitry coupled to the capacitor, the comparator circuitry configured to compare a voltage at the capacitor to a threshold voltage;

timer circuitry coupled to the comparator circuitry, the timer circuitry configured to determine a time that the voltage of the capacitor is equal to the threshold voltage;

configuration determination circuitry coupled to the timer circuitry, the configuration determination circuitry configured to determine a configuration responsive to determining the time; and a configuration register coupled to the configuration determination circuitry, the configuration register configured to determine an address of the apparatus.

16. The apparatus of claim 15, further comprising a connector coupled to the capacitor, the connector configured to be coupled to a controller area network (CAN) BUS, wherein the apparatus is configured to transmit or receive data using the CAN BUS.

17. An apparatus comprising:

a capacitor;

comparator circuitry coupled to the capacitor, the comparator circuitry configured to compare a voltage at the capacitor to a threshold voltage;

timer circuitry coupled to the comparator circuitry, the timer circuitry configured to determine a time that the voltage of the capacitor is equal to the threshold voltage; and configuration determination circuitry coupled to the timer circuitry, the configuration determination circuitry configured to determine a configuration responsive to determining the time, wherein the timer circuitry is further configured to:

start incrementing a reference count responsive to beginning to discharge the capacitor; and stop incrementing the reference count responsive to the voltage of the capacitor being equal to the threshold voltage, the reference count represents the time.

18. The apparatus of claim 17, further comprising a configuration register coupled to the configuration determination circuitry, the configuration register configured to determine an address of the apparatus.

19. An apparatus comprising:

a capacitor;

comparator circuitry coupled to the capacitor, the comparator circuitry configured to compare a voltage at the capacitor to a threshold voltage;

timer circuitry coupled to the comparator circuitry, the timer circuitry configured to determine a time that the voltage of the capacitor is equal to the threshold voltage, wherein the time represents a count value of counter circuitry;

configuration determination circuitry coupled to the timer circuitry, the configuration determination circuitry configured to determine a configuration responsive to determining the time; and a look up table (LUT) having a plurality of configurations of the apparatus, each one of the plurality of configurations corresponds to range of possible count values.

20. The apparatus of claim 19, wherein the configuration determination circuitry further configured to determine the configuration by selecting one of the plurality of configurations of the apparatus that corresponds to the time.

* * * * *